(12) United States Patent
Lee et al.

(10) Patent No.: US 11,386,849 B2
(45) Date of Patent: Jul. 12, 2022

(54) LIGHT EMITTING DISPLAY DEVICE AND METHOD OF DRIVING SAME

(71) Applicant: LG Display Co., Ltd., Seoul (KR)

(72) Inventors: Jin-Woo Lee, Seoul (KR); Hye-Min Park, Goyang-si (KR); Tae-Gung Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 149 days.

(21) Appl. No.: 16/984,981

(22) Filed: Aug. 4, 2020

(65) Prior Publication Data

US 2021/0074223 A1 Mar. 11, 2021

(30) Foreign Application Priority Data

Sep. 6, 2019 (KR) .................. 10-2019-0111011

(51) Int. Cl.
*G09G 3/30* (2006.01)
*G09G 3/3275* (2016.01)
*G09G 3/3266* (2016.01)
*H01L 27/32* (2006.01)

(52) U.S. Cl.
CPC ......... *G09G 3/3275* (2013.01); *G09G 3/3266* (2013.01); *H01L 27/3218* (2013.01)

(58) Field of Classification Search
CPC ...... G09G 3/32; G09G 3/3275; G09G 3/3266; G09G 5/00; G09G 3/30; H01L 27/3218; G06F 3/038
See application file for complete search history.

(56) References Cited

U.S. PATENT DOCUMENTS

| | | | |
|---|---|---|---|
| 2014/0267215 A1 | 9/2014 | Soni et al. | |
| 2014/0307012 A1* | 10/2014 | Kishi | G09G 3/3233 345/691 |
| 2016/0071445 A1* | 3/2016 | Kim | G09G 3/3291 345/212 |
| 2016/0351160 A1* | 12/2016 | In | G09G 3/3225 |
| 2019/0035335 A1 | 1/2019 | Kim et al. | |
| 2019/0180675 A1* | 6/2019 | Jang | G09G 3/32 |
| 2020/0020277 A1* | 1/2020 | Lee | G09G 3/3233 |

FOREIGN PATENT DOCUMENTS

| | | |
|---|---|---|
| CN | 102024428 A | 4/2011 |
| CN | 107799060 A | 3/2018 |
| CN | 109308877 A | 2/2019 |
| CN | 109308879 A | 2/2019 |
| EP | 3293728 A2 | 3/2018 |
| KR | 10-2018-0046322 A | 5/2018 |
| TW | 201128604 A1 | 8/2011 |
| TW | 201812732 A | 4/2018 |

* cited by examiner

Primary Examiner — Pegeman Karimi
(74) Attorney, Agent, or Firm — Birch, Stewart, Kolasch & Birch, LLP

(57) ABSTRACT

An embodiment of the present invention provides a light emitting display device including a display panel including M (M being an integer equal to or greater than 2) subpixels sharing a single sensing line, and a circuit for sensing elements included in at least one of the M subpixels through the sensing line. A first subpixel from among the M subpixels can be defined as a sensing subpixel, a second subpixel can be defined as a non-sensing subpixel. The second subpixel can have an initial period for applying an initialization voltage for a time longer than a data writing period for applying a sensing voltage to the first subpixel.

14 Claims, 11 Drawing Sheets

LIGHT EMITTING DISPLAY DEVICE AND METHOD OF DRIVING SAME

CROSS-REFERENCE TO RELATED APPLICATIONS

This application claims the priority benefit under 35 U.S.C. § 119(a) to Korean Patent Application No. 10-2019-0111011, filed in the Republic of Korea on Sep. 6, 2019, the entire contents of which are hereby expressly incorporated by reference into the present application.

BACKGROUND OF THE INVENTION

Field of the Invention

The present invention relates to a light emitting display device and a method of driving the same.

Discussion of the Related Art

With the development of information technology, the market for display devices that are connecting media between users and information is expanding. Accordingly, display devices such as a light emitting display (LED), a quantum dot display (QDD), and a liquid crystal display (LCD) are increasingly used.

The aforementioned display devices include a display panel including subpixels, a driver which outputs a driving signal for driving the display panel, and a power supply which generates power to be supplied to the display panel and the driver.

The aforementioned display devices can display an image in such a manner that selected subpixels transmit light or directly emit light when driving signals, for example, a scan signal and a data signal, are supplied to the subpixels formed in the display panel.

Among the aforementioned display device, the light emitting display device has various advantages such as electrical and optical characteristics of a high response speed, a high luminance and a wide viewing angle and mechanical characteristics of implementation in a flexible form. However, the light emitting display device needs improvement of a compensation circuit configuration and thus consistent research related thereto is demanded.

SUMMARY OF THE INVENTION

An object of the present invention to substantially obviate the aforementioned problems and other limitations is to converge voltages around sensing nodes upon almost the same initialization voltages even when the sensing nodes are initialized using a voltage lower than a threshold voltage of OLEDs, reduce a sensing deviation generation probability on the basis of the almost same initialization voltages, and improve sensing accuracy and compensation accuracy (compensate for image sticking) to realize a screen with high display quality.

To accomplish the objects, an embodiment of the present invention provides a light emitting display device including a display panel including M (M being an integer equal to or greater than 2) subpixels sharing a single sensing line and a circuit for sensing elements included in at least one of the M subpixels through the sensing line. A first subpixel from among the M subpixels can be defined as a sensing subpixel, a second subpixel can be defined as a non-sensing subpixel, and the second subpixel can have an initial period for applying an initialization voltage for a time longer than a data writing period for applying a sensing voltage to the first subpixel.

The initial period for the second subpixel can occur ceaselessly.

The initial period for the second subpixel can be longer than a sensing period for sensing the first subpixel.

A data writing period for the first subpixel and a sensing period for the first subpixel can alternate.

The data writing period for the first subpixel and the sensing period for the first subpixel can be alternately repeated K times (K being an integer equal to or greater than 2) and discontinuously occur distinguished from the initial period for the second subpixel.

The initial period for the second subpixel can occur ceaselessly for an I-th time, wherein the I-th time can be defined as (A) a time longer than the data writing period, (B) a time longer than the sensing period, (C) a time longer than a boosting period present between the data writing period and the sensing period, (D) a time necessary for at least two of the data writing period, the boosting period and the sensing period, or (E) a time corresponding to the sum of the data writing period and the sensing period.

The sensing voltage can be set to a voltage level at which an organic light-emitting diode (OLED) included in the first subpixel emits light, the initialization voltage can be set to a voltage level at which an OLED included in the second subpixel does not emit light, the first subpixel can have a resistance value lower than that of the second subpixel, and the second subpixel can have a resistance value higher than that of the first subpixel.

One period in which repeated sensing is performed K times can be included in one line of the display panel, and the periods in all lines of the display panel may not overlap such that a sensing line is not repeatedly selected.

In another aspect, the present invention provides a method of driving a light emitting display device, including: applying an initialization voltage for initializing an OLED included in a non-sensing subpixel from among M subpixels in an initial period; applying a sensing voltage for sensing an OLED included in a sensing subpixel from among the M subpixels in a data writing period; floating an anode electrode of the OLED included in the sensing subpixel in a boosting period; and sensing the OLED included in the sensing subpixel in a sensing period. The initial period can be longer than the data writing period.

The initial period can occur ceaselessly, and the data writing period and the sensing period can be alternately repeated K times (K being an integer equal to greater than 2) and discontinuously occur distinguished from the initial period.

The embodiments of the present invention have the effect of converging voltages around sensing nodes upon almost the same initialization voltages even when the sensing nodes are initialized using a voltage lower than the threshold voltage of OLEDs. In addition, the embodiments of the present invention have the effects of reducing a sensing deviation generation probability on the basis of conditions for sufficient initialization of non-sensing subpixels and improving sensing accuracy and compensation accuracy (compensation for image sticking) to realize a screen with high display quality.

DETAILED DESCRIPTION OF THE EMBODIMENTS

Figure 1:
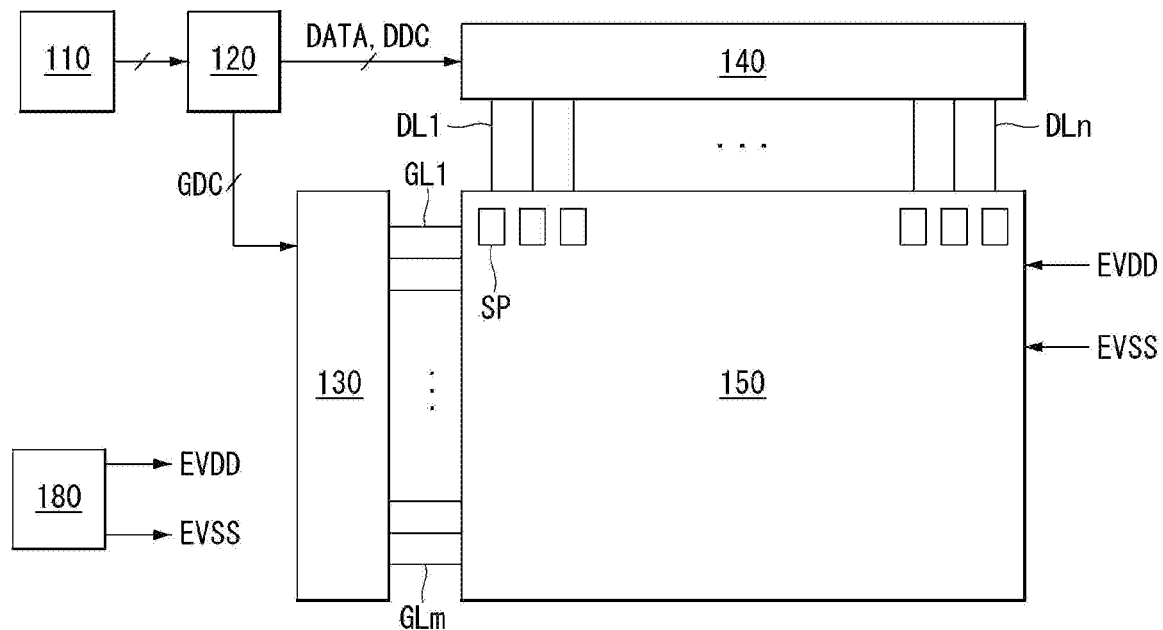
FIG. 1 is a block diagram schematically showing an organic light emitting display device according to an embodiment of the present invention.

Hereinafter, embodiments of the present invention will be described with reference to the attached drawings.

A light emitting display device according to the embodiments of the present invention can be implemented in the form of a TV receiver, a video player, a personal computer (PC), a home theater, a vehicle electronic device, a smartphone, a wearable electronic device, a navigation device, or the like, but the present invention is not limited thereto.

In addition, a light emitting display device which will be described below is applicable to not only an organic light emitting display device based on organic light-emitting diode but also an inorganic light emitting display device based on an inorganic light-emitting diode. However, the following description will be given on the basis of the organic light emitting display device.

Further, the organic light emitting display device which will be described below performs an image display operation and an external compensation operation. The external compensation operation can be performed in subpixel or pixel units. The external compensation operation can be performed in a vertical blank period during an image display operation, a power on sequence period before image display starts, or a power off sequence period after image display ends.

The vertical blank period is a period in which a data signal for image display is not written and is disposed between vertical active periods in which a data signal corresponding to one frame is written. The power on sequence period refers to a period from when the device is powered on to when an image is displayed. The power off sequence period refers to a period from when image display ends to when the device is powered off.

External compensation can be used to sense a source voltage when a source node potential of a driving transistor is saturated (i.e., when the current Ids of a driving TFT becomes zero) in order to compensate for a threshold voltage deviation of driving transistors. In addition, external compensation can be used to sense a value of a linear state before a source node of a driving transistor reaches a saturation state in order to compensate for a mobility deviation of driving transistors.

Further, external compensation can be used to sense a current flowing through a sensing node defined between a source electrode of a driving transistor and an anode electrode of an organic light-emitting diode in order to compensate for a threshold voltage deviation of driving transistors. In addition, external compensation can be used to sense charges accumulated in a parasitic capacitor of an organic light-emitting diode in order to compensate for deterioration of the organic light-emitting diode. As described above, external compensation can be used to sense a voltage charged in a line or an electrode, a current flowing through a node, charges accumulated in a parasitic capacitor, and the like and compensate for deterioration of an element included in a subpixel on the basis of the sensed results.

Meanwhile, although a subpixel which will be described below includes an n-type thin film transistor (TFT) in the following description, the subpixel can include a p-type TFT or both n-type and p-type TFTs. A TFT is a tri-electrode element including a gate, a source, and a drain. The source is an electrode which supplies carriers to the transistor. Carriers flow from the source in the TFT. The drain is an electrode from which carriers are emitted in the TFT. For example, carries flow from the source to the drain in the TFT.

In the case of the n-type TFT, carriers are electrons and thus a source voltage is lower than a drain voltage such that electrons can flow from the source to the drain. Since electrons flow from the source to the drain in the n-type TFT, current flows from the drain to the source. On the other hand, in the case of the p-type TFT, carriers are holes and thus a source voltage is higher than a drain voltage such that holes can flow from the source to the drain. Since holes flow from the source to the drain in the p-type TFT, current flows from the source to the drain. However, the source and the drain of the TFT can be changed according to an applied voltage. In the following description, one of the source and the drain is referred to as a first electrode and the other is referred to as a second electrode.

Figure 2:
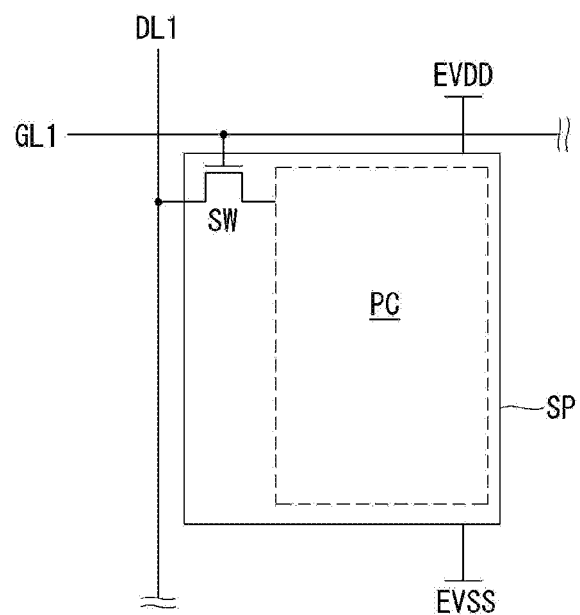
FIG. 2 is a configuration diagram schematically showing a subpixel SP shown in FIG. 1.

FIG. 1 is a block diagram schematically showing an organic light emitting display device according to an embodiment of the present invention and FIG. 2 is a configuration diagram schematically showing a subpixel shown in FIG. 1. All the components of the organic light emitting display device according to all embodiments of the present invention are operatively coupled and configured.

As shown in FIGS. 1 and 2, the organic light emitting display device according to an embodiment of the present invention includes an image provider 110, a timing controller 120, a scan driver 130, a data driver 140, a display panel 150, a power supply 180, and the like.

The image provider 110 (or host system) outputs various driving signals along with an externally provided image data signal or an image data signal stored in an internal memory. The image provider 110 can supply data signals and various driving signals to the timing controller 120.

The timing controller 120 outputs a gate timing control signal GDC for controlling operation timing of the scan driver 130, a data timing control signal DDC for controlling operation timing of the data driver 140, and various synchronization signals (a vertical synchronization signal and a horizontal synchronization signal).

The timing controller 120 provides a data signal DATA supplied from the image provider 110 to the data driver 140 along with the data timing control signal DDC. The timing controller 120 can be configured in the form of an integrated circuit (IC) and mounted on a printed circuit board, but the present invention is not limited thereto.

The scan driver 130 outputs a scan signal (or scan voltage) in response to the gate timing control signal GDC supplied from the timing controller 120. The scan driver 130 provides scan signals to subpixels included in the display panel 150 through scan lines GL1 to GLm where m can be a positive integer equal to or greater than 2. The scan driver 130 is configured in the form of an IC or is directly formed on the display panel 150 in a gate-in-panel form, but the present invention is not limited thereto.

The data driver 140 samples and latches the data signal DATA in response to the data timing control signal DDC supplied from the timing controller 120, converts the data signal DATA in a digital form into a data voltage in an analog form on the basis of a gamma reference voltage and outputs the data voltage.

The data driver 140 provides the data voltage to the subpixels included in the display panel 150 through data lines DL1 to DLn where n can be a positive integer equal to or greater than 2. The data driver 140 can be configured in the form of an IC and mounted on the display panel 150 or a printed circuit board, but the present invention is not limited thereto.

The power supply 180 generates and outputs first power EVDD having a high potential and second power EVSS having a low potential on the basis of an external input voltage supplied from the outside. The power supply 180 can generate and output a voltage (e.g., a scan high voltage or a scan low voltage) necessary to drive the scan driver 130 or a voltage (e.g., a drain voltage or a half drain voltage) necessary to drive the data driver 140 as well as the first power EVDD and the second power EVSS.

The display panel 150 displays an image in response to driving signals including a scan signal and a data voltage supplied from drivers including the scan driver 130 and the data driver 140 and the first power EVDD and the second power EVSS supplied from the power supply 180. The subpixels of the display panel 150 directly emit light.

The display panel 150 can be formed based on a rigid or flexible substrate such as a glass, silicon or polyimide substrate. Subpixels emitting light can be composed of red, green and blue pixels, or red, green, blue and white pixels, or some other variations.

For example, a single subpixel SP (e.g., each of the subpixels) includes a pixel circuit PC having a switching transistor SW, a driving transistor, a storage capacitor, an organic light-emitting diode, and the like. Subpixels SP used in the organic light emitting display device directly emit light and thus have a complicated circuit configuration. Further, a compensation circuit for compensating for deterioration of organic light-emitting diodes emitting light and driving transistors that supply driving current to the organic light-emitting diodes can be configured in various manners. Accordingly, a pixel circuit PC included in a subpixel SP is illustrated in the form of a block.

Although the timing controller 120, the scan driver 130 and the data driver 140 have been described as separate components above, one or more of the timing controller 120, the scan driver 130 and the data driver 140 can be integrated into a single IC according to implementation of the organic light emitting display device.

Figure 3:
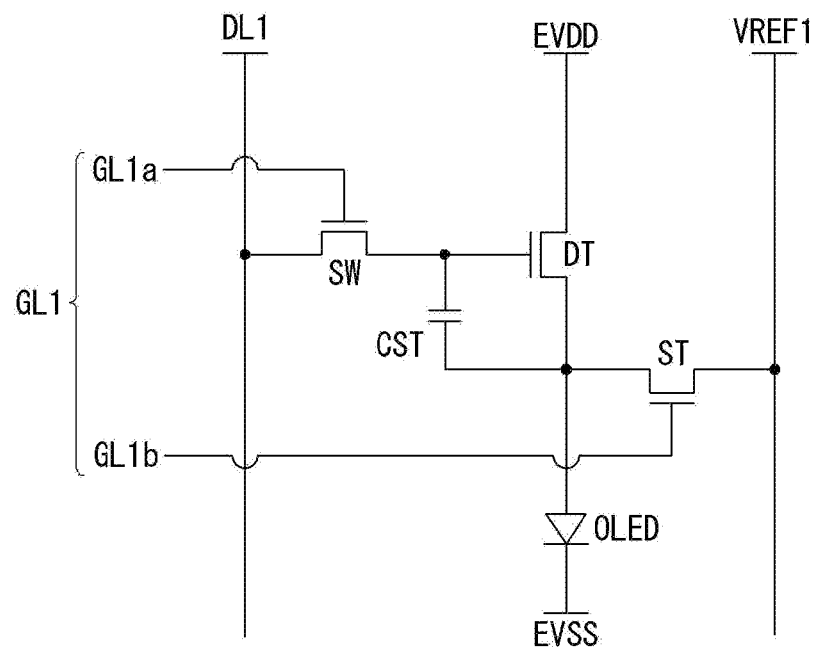
FIG. 3 is an equivalent circuit diagram showing a subpixel including a compensation circuit according to an embodiment of the present invention.
Figure 4:
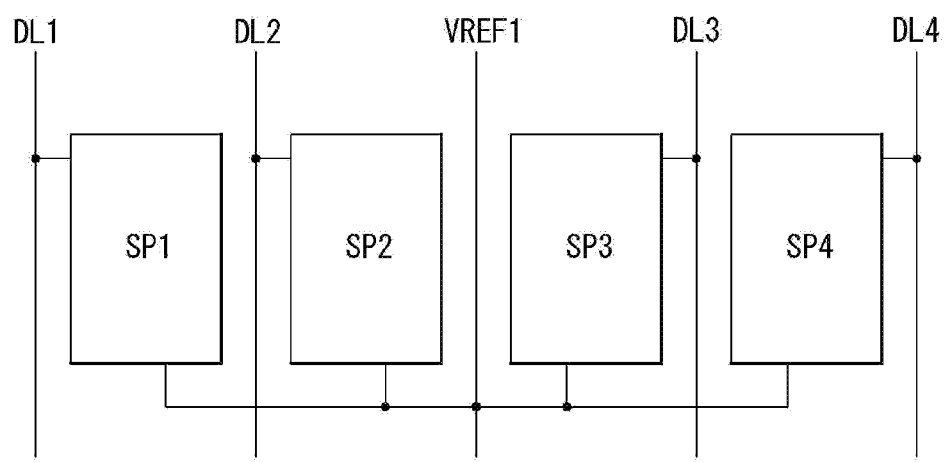
FIGS. 4 and 5 illustrate pixels that can be implemented on the basis of the subpixel of FIG. 3.
Figure 5:
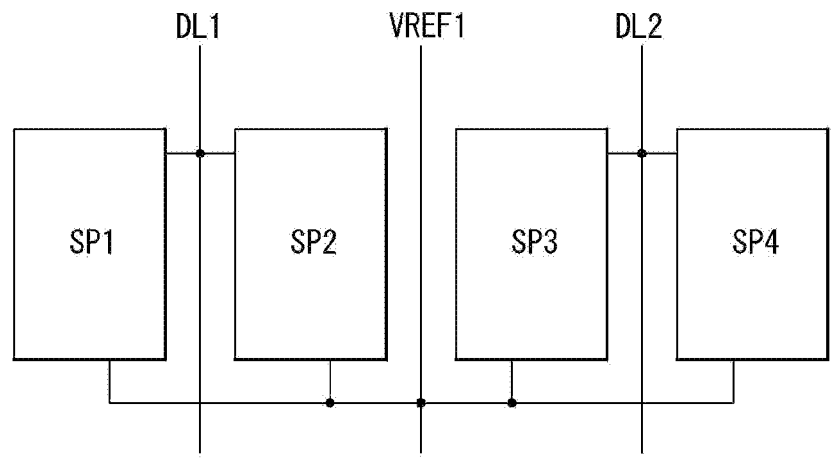

FIG. 3 is an equivalent circuit diagram showing an example of a subpixel including a compensation circuit according to an embodiment of the present invention and FIGS. 4 and 5 illustrate pixels that can be implemented on the basis of the subpixel of FIG. 3. The subpixel(s) of FIGS. 3-5 can be the subpixel(s) of FIG. 1.

As shown in FIG. 3, a subpixel including a compensation circuit according to an embodiment of the present invention includes a switching transistor SW, a sensing transistor ST, a driving transistor DT, a capacitor CST, and an organic light-emitting diode OLED.

The switching transistor SW includes a gate electrode connected to a first A scan line GL1a, a first electrode connected to a first data line DL1, and a second electrode connected to a gate electrode of the driving transistor DT. The driving transistor DT includes the gate electrode connected to the capacitor CST, a first electrode connected to a first power line EVDD, and a second electrode connected to an anode electrode of the organic light-emitting diode OLED.

The capacitor CST includes a first electrode connected to the gate electrode of the driving transistor DT and a second electrode connected to the anode electrode of the organic light-emitting diode OLED. The organic light-emitting diode OLED includes the anode electrode connected to the second electrode of the driving transistor DT and a cathode electrode connected to a second power line EVSS.

The sensing transistor ST includes a gate electrode connected to a first B scan line GL1b, a first electrode connected to a first sensing line VREF1, and a second electrode connected to the anode electrode of the organic light-emitting diode OLED which is a sensing node. The sensing transistor ST is a compensation circuit added to sense deterioration or threshold values of the driving transistor DT and the organic light-emitting diode OLED. The sensing transistor ST acquires a sensing value through a sensing node defined between the driving transistor DT and the organic light-emitting diode OLED. The sensing value acquired through the sensing transistor ST is transmitted to an external compensation circuit provided outside the subpixel through the first sensing line VREF1.

The first A scan line GL1a connected to the gate electrode of the switching transistor SW and the first B scan line GL1b connected to the gate electrode of the sensing transistor ST can be separate as shown or can be commonly connected. It is possible to reduce the number of scan lines to prevent an aperture ratio from decreasing due to addition of a compensation circuit according to a gate electrode common connection structure.

As shown in FIGS. 4 and 5, first to fourth subpixels SP1 to SP4 including a compensation circuit according to an embodiment of the present invention can be defined to constitute a pixel. Here, the first to fourth subpixels SP1 to SP4 can be arranged in the order of subpixels emitting red, green, blue and white light, but the present invention is not limited thereto.

As shown in the first example of FIG. 4, the first to fourth subpixels SP1 to SP4 including the compensation circuit can be connected such that they share the first sensing line VREF1 and are respectively connected to the first to fourth data lines DL1 to DL4.

As shown in the second example of FIG. 5, the first to fourth subpixels SP1 to SP4 including the compensation circuit can be connected in such a manner that the first to fourth subpixels SP1 to SP4 share the first sensing line VREF1 and two subpixels are commonly connected to a single data line. For example, the first and second subpixels SP1 and SP2 can share the first data line DL1 and the third and fourth subpixels SP3 and SP4 share the second data line DL2.

However, FIGS. 4 and 5 merely show two examples, and the present invention is applicable to display panels having different subpixel structures which are not illustrated and described. For example, the present invention is applicable to a display panel based on an external compensation circuit in which M (M being equal to or greater than 2) subpixels share a single sensing line. Furthermore, the present invention is applicable to a structure in which a compensation circuit is present in a subpixel or a structure in which a compensation circuit is not present in a subpixel.

Figure 6:
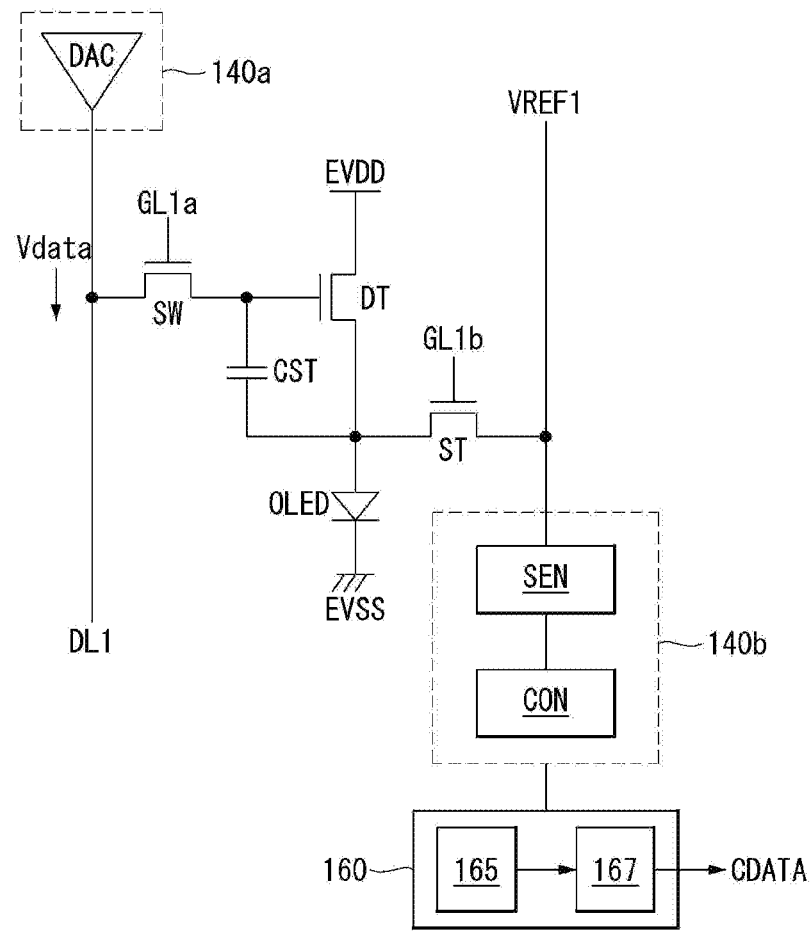
FIG. 6 is a first exemplary diagram separately illustrating main blocks of an organic light emitting display device according to an embodiment of the present invention.
Figure 7:
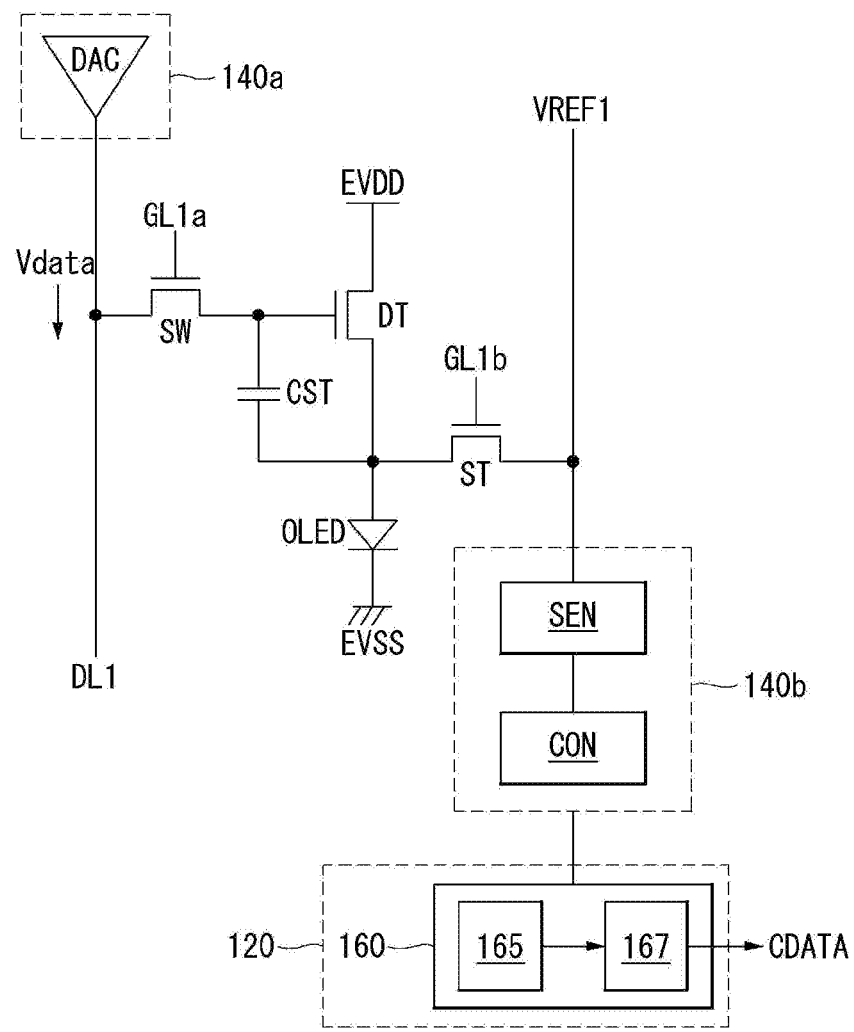
FIGS. 7 and 8 are second exemplary diagrams separately illustrating main blocks of an organic light emitting display device according to an embodiment of the present invention.
Figure 8:
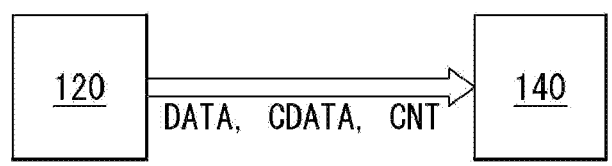

FIG. 6 is a first exemplary diagram separately illustrating main blocks of an organic light emitting display device according to an embodiment of the present invention and FIGS. 7 and 8 are second exemplary diagrams separately illustrating main blocks of an organic light emitting display device according to an embodiment of the present invention.

As shown in FIG. 6, the organic light emitting display device according to the embodiment of the present invention includes a circuit that supplies a data voltage to subpixels, senses elements included in the subpixels and generates a compensation value on the basis of a sensing value obtained through sensing.

Data drivers 140*a* and 140*b* are circuits for performing a driving operation, such as supplying a data voltage to subpixels and an operation of sensing elements included in the subpixels, and can include a first circuit 140*a* and a second circuit 140*b*. However, an external compensation circuit such as the second circuit 140*b* can be configured as a separate device.

The first circuit 140*a* outputs a data voltage Vdata for operating subpixels and can include a data voltage output unit DAC. The data voltage output unit DAC converts a digital data signal supplied from a timing controller into an analog voltage and outputs the analog voltage. An output terminal of the data voltage output unit DAC is connected to a first data line DL1. The data voltage output unit DAC can output voltages (e.g., a sensing voltage, a black voltage and the like) necessary for a compensation operation as well as the data voltage Vdata necessary for image representation.

The second circuit 140*b* is a circuit for sensing elements included in a subpixel and can include a sensing circuit SEN for acquiring a sensing value and a sensing value converter CON for converting a sensing value. The sensing circuit SEN can sense characteristics of elements included in a subpixel through the first sensing line VREF1. The sensing value converter CON can sample an analog sensing value output from the sensing circuit SEN, convert the sampled analog sensing value into a digital sensing value and output the digital sensing value.

For example, the sensing circuit SEN can sense a voltage charged in a line capacitor of the first sensing line VREF1 (parasitic capacitor formed along the first sensing line), and sense and compensate for characteristics of elements included in a subpixel on the basis of the sensed voltage. As another example, the sensing circuit SEN can sense a current flowing through a sensing node connected to the first sensing line VREF1, and sense and compensate for characteristics of elements included in the subpixel on the basis of the sensed current. As another example, the sensing circuit SEN can sense charges accumulated in a parasitic capacitor of an organic light-emitting diode through the first sensing line VREF1, and sense and compensate for characteristics of elements included in the subpixel on the basis of the sensed charges.

The compensation circuit 160 is a circuit for performing image analysis and generating a compensation value on the basis of a sensing value and can include an image analyzer 165 and a compensation value generator 167. The image analyzer 165 can serve to analyze a data signal input from the outside and a sensing value output from the sensing value converter CON. The compensation value generator 167 can serve to determine a degree of deterioration of a sensed element and generate a compensation value necessary for compensation in response to an analysis result output from the image analyzer 165.

As shown in FIGS. 7 and 8, when the first and second circuits 140*a* and 140*b* are included in the data driver 140, the compensation circuit 160 can be included in the timing controller 120. Accordingly, the timing controller 120 can supply a compensated data signal CDATA obtained by compensating for a data signal DATA on the basis of a compensation value to the data driver 140. Further, the timing controller 120 can supply a control signal CNT for controlling the first and second circuits 140*a* and 140*b* to the data driver 140.

A method of driving an organic light emitting display device which will be described below pertains to sensing charges accumulated in a parasitic capacitor of an OLED and compensating for deterioration of the OLED on the basis of the sensed charges. The parasitic capacitor of the OLED tends to decrease in capacitance thereof as the OLED deteriorates.

Accordingly, it is possible to detect change (capacitance change) in the parasitic capacitor of the OLED on the basis of the principle of charge equilibrium by sensing charges accumulated in the parasitic capacitor of the OLED. In addition, it is possible to compensate for deterioration or a threshold value of the OLED on the basis of change (capacitance change) in the parasitic capacitor of the OLED (voltage compensation, gain compensation, gamma compensation, etc.).

An operation of sensing charges accumulated in the parasitic capacitor of the OLED can be performed as follows, but the present invention is not limited thereto.

First, the driving transistor DT is turned off, an initialization voltage is applied to the OLED through the first sensing line VREF1 and then the OLED is turned on (emits light) in an initial period. The initial period is followed by a data writing period for generating a sensing voltage in the OLED through the first data line DL1. The data writing period is followed by a boosting period for setting an operating point voltage of the OLED while floating the anode electrode of the OLED. The boosting period is followed by a sensing period in which the first sensing line VREF1 and the anode electrode of the OLED are electrically connected (a discharging path is formed) to sense charges accumulated in the parasitic capacitor of the OLED.

Figure 9:
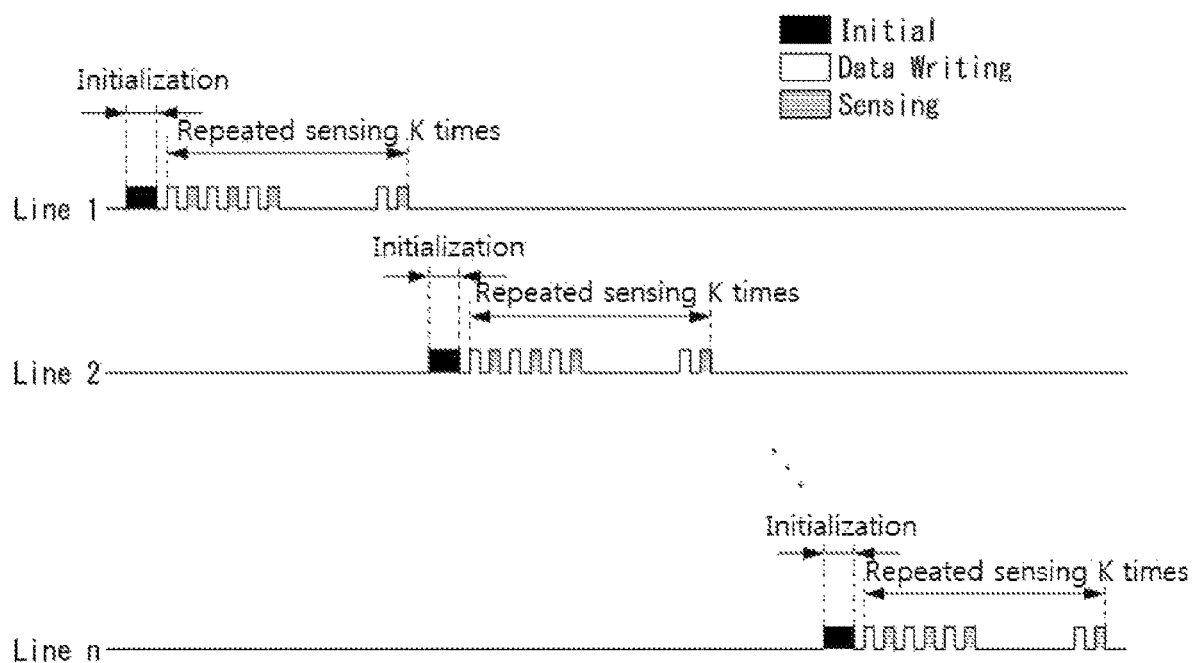
FIG. 9 is a diagram for describing a method of driving an organic light emitting display device according to an embodiment of the present invention.
Figure 10:
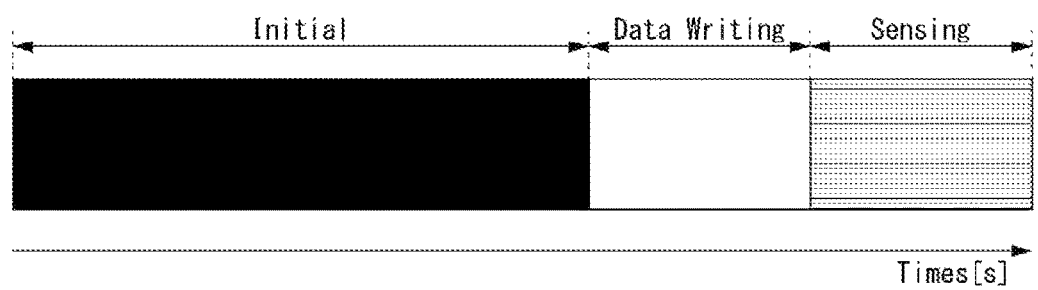
FIG. 10 is a diagram for describing differences between an initial period, a data writing period and a sensing period of FIG. 9.
Figure 11:
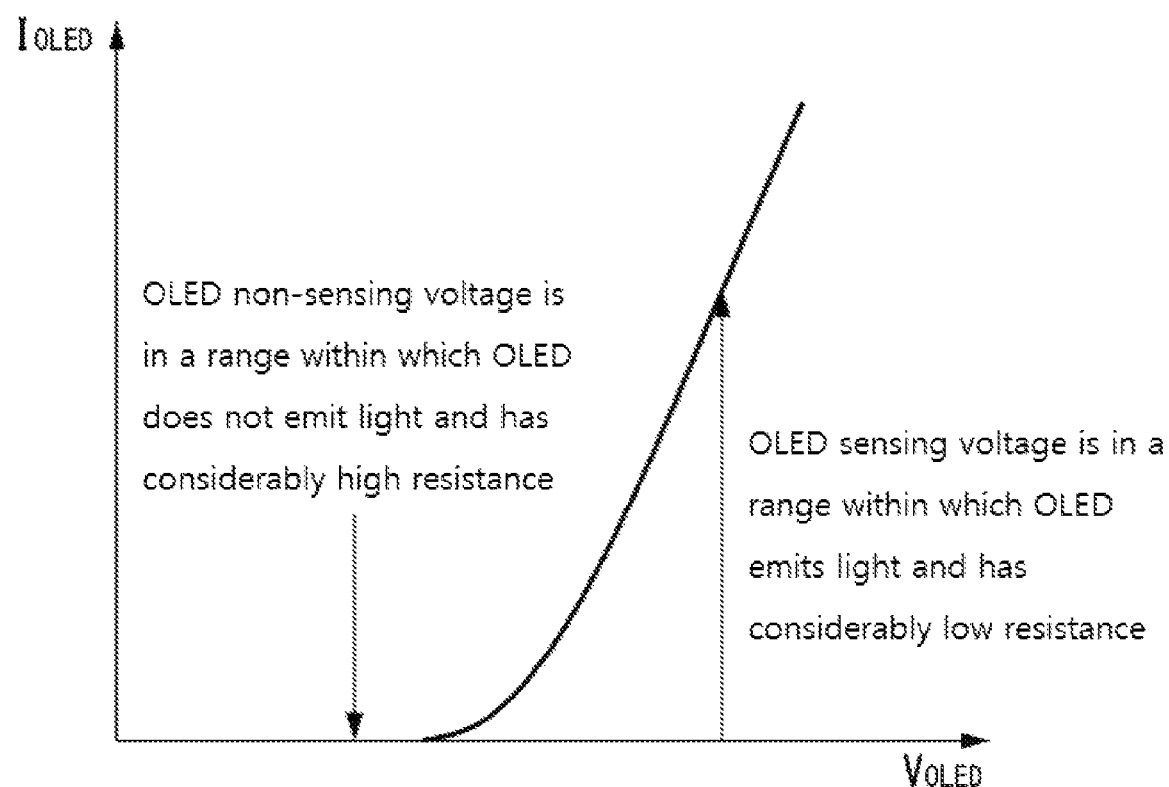
FIGS. 11 and 12 are diagrams for describing the effects of the embodiment of the present invention.
Figure 12:
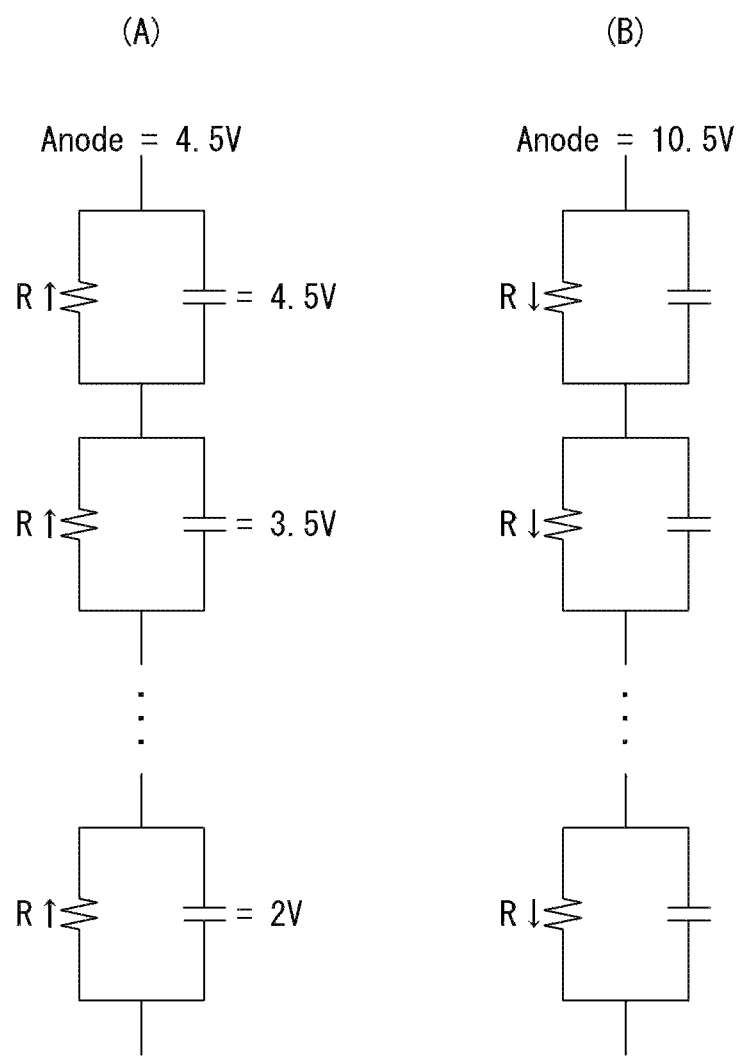

FIG. 9 is a diagram for describing a method of driving an organic light emitting display device according to an embodiment of the present invention, FIG. 10 is a diagram for describing differences between an initial period, a data writing period and a sensing period of FIG. 9, and FIGS. 11 and 12 are diagrams for describing the effects of the embodiment of the present invention.

As shown in FIGS. 6 and 9, a method of driving an organic light emitting display device according to an embodiment of the present invention includes an initial period, a data writing period and a sensing period. A boosting period can be present between the data writing period and the sensing period.

The initial period refers to a period in which an initialization voltage is written (charged) to a non-sensing subpixel (one or more subpixels that are not included in subpixels to be sensed and are selected at a first time). The data writing period refers to a period in which a sensing voltage is written (charged) to a sensing subpixel (a subpixel that is included in subpixels to be sensed and is selected at the first time or a second time). The sensing period refers to a period in which charges accumulated in a sensing subpixel (one or more subpixels that are included in subpixels to be sensed and are selected at the second time or a third time) is sensed.

The initialization voltage is written to a non-sensing subpixel instead of a sensing subpixel to initialize the non-sensing subpixel in order to minimize the influence of the non-sensing subpixel on the sensing subpixel when the sensing subpixel is sensed because a plurality of subpixels share a sensing line. In addition, when the initial period increases, an additional initial period can be deleted for a period in which sensing is repeated (initialization is not performed each time and a long initial period is inserted before repeated sensing).

The initial period lasts consecutively (continuously/constantly) for n I-th time in order to provide a sufficient initialization time to non-sensing subpixels. Here, the I-th time can be defined as a time longer than the data writing period, a time longer than the sensing period, a time longer than the boosting period present between the data writing period and the sensing period, a time taken to perform at least two of the data writing, boosting and sensing, or a time corresponding to the sum of the data writing period and the sensing period.

However, the data writing period and the sensing period are alternately repeated K (K being an integer equal to or greater than 2) times in order to provide repeated sensing K times to sensing subpixels. The data writing period and the sensing period are alternately repeated and discontinuously occur distinguished from the initial period that continuously occurs. For instance, K can be 16, 32, 64, or the like. When the number of time K of repeated sensing is increased, sensing accuracy can be improved.

As shown in FIGS. 9 and 10, the initial period occurs (ceaselessly) for a time longer than the data writing period and/or the sensing period. The initial period can ceaselessly occur for a time longer than one data writing period or one sensing period. The duration of the initial period can be longer than the sum of one data writing period and one sensing period.

FIG. 10 shows a bar graph for comparing durations of the initial period, the data writing period and the sensing period.

As shown in FIGS. 11 and 12, a non-sensing voltage of an OLED (OLED non-sensing voltage) belongs to a voltage level (e.g., 4.5 V) of a range within which the OLED does not emit light and a resistance value R can be considerably higher than those of (B) in FIG. 12. On the other hand, a sensing voltage of the OLED (OLED sensing voltage) belongs to a voltage level (e.g., 10.5 V) of a range within which the OLED emits light and a resistance value R can be considerably lower than those of (A) in FIG. 12.

Accordingly, when the initial period becomes longer, charging conditions can be satisfied even when the OLED included in a non-sensing subpixel is charged with a voltage (e.g., 4.5 V) lower than the threshold voltage of the OLED. For example, when initialization is performed using a voltage lower than the threshold voltage of the OLED, a problem that an initialization voltage is not correctly applied to the OLED can be solved if a longer initialization time is assigned. In addition, a problem that, when non-sensing subpixels are not initialized for a sufficient time (e.g., at least 3 ms) (in the case of insufficient initialization time), sensing accuracy or compensation accuracy deteriorates due to a sensing deviation (caused by charge differences in parasitic capacitors) during repeated sensing can be solved to improve display quality.

Meanwhile, one period in which repeated sensing occurs K times after a long initial period can be included in one line. In addition, the periods in which repeated sensing occurs K times do not overlap in all lines of the display panel (for example, a sensing line is not repeatedly selected). Here, a first line (Line 1) includes specific subpixels (e.g., four subpixels including red, green, blue and white subpixels) arranged in one horizontal line defined on the display panel.

For example, if sensing operation is performed on the first pixel of the first line (Line 1) for a first time, sensing operation for the second pixel of the second line (Line 2) is performed for a second time different from the first time, and this operation can be sequentially performed until an N-th pixel of an N-th line (Line n) that is the last line.

The second pixel of the second line (Line 2) following the first pixel of the first line (Line 1) is mentioned in the above example. Here, the first pixel of the first line (Line 1) and the second pixel of the second line (Line 2) can be vertically neighboring pixels or pixels far away from each other. Although sensing operation is sequentially performed from the first line (Line 1) to the N-th line (Line n) in the above example, sensing operation can be performed in reverse order or random sensing operation can be performed.

Figure 13:
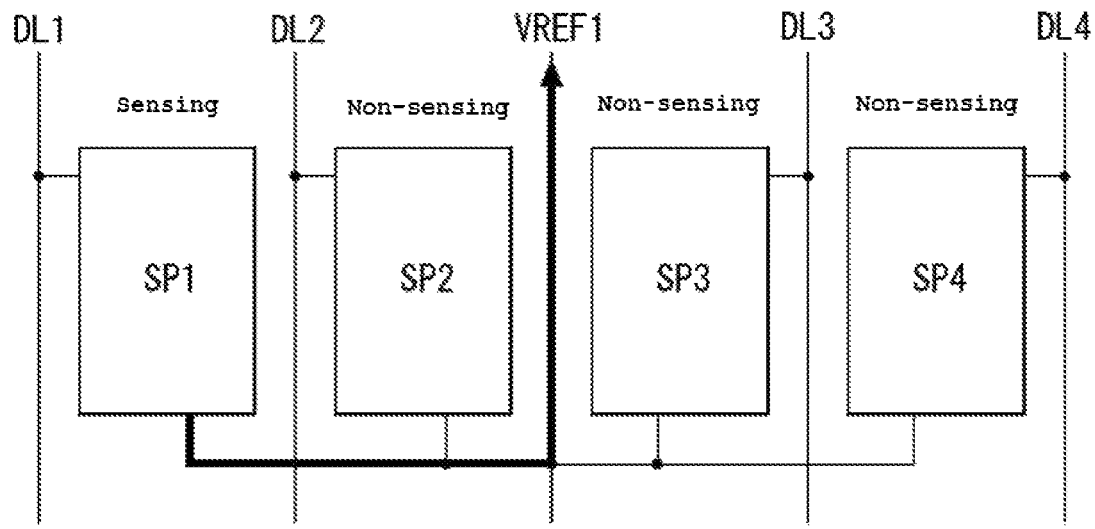
FIG. 13 is an exemplary diagram for aiding in understanding sensing and initialization methods according to an embodiment of the present invention.
Figure 14:
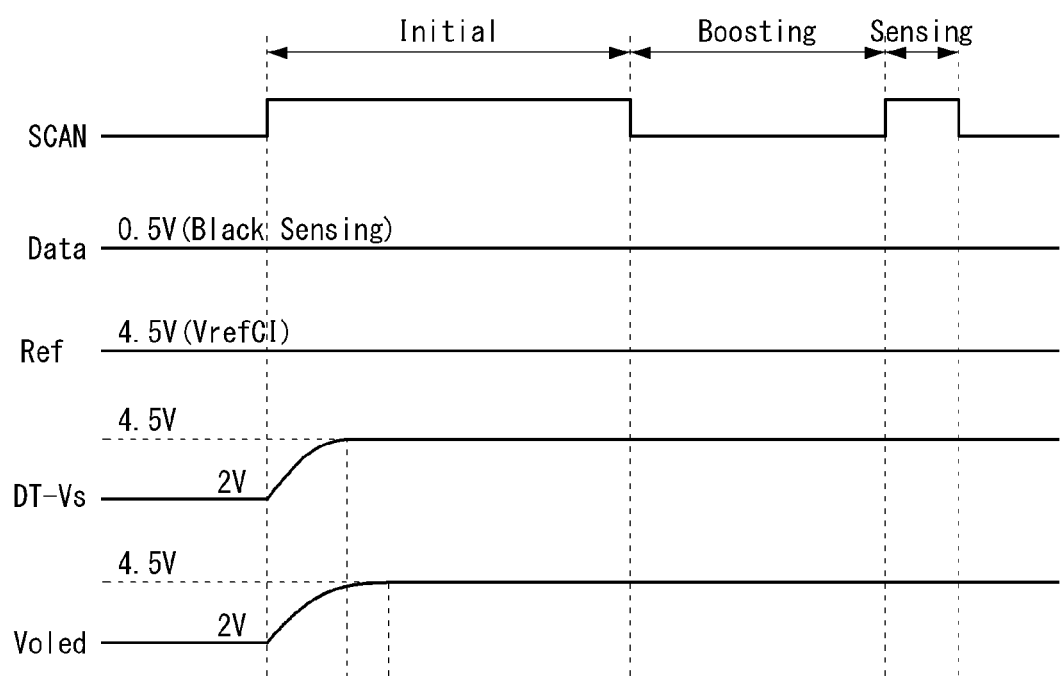
FIG. 14 illustrates driving waveforms of subpixels of FIG. 13.
Figure 15:
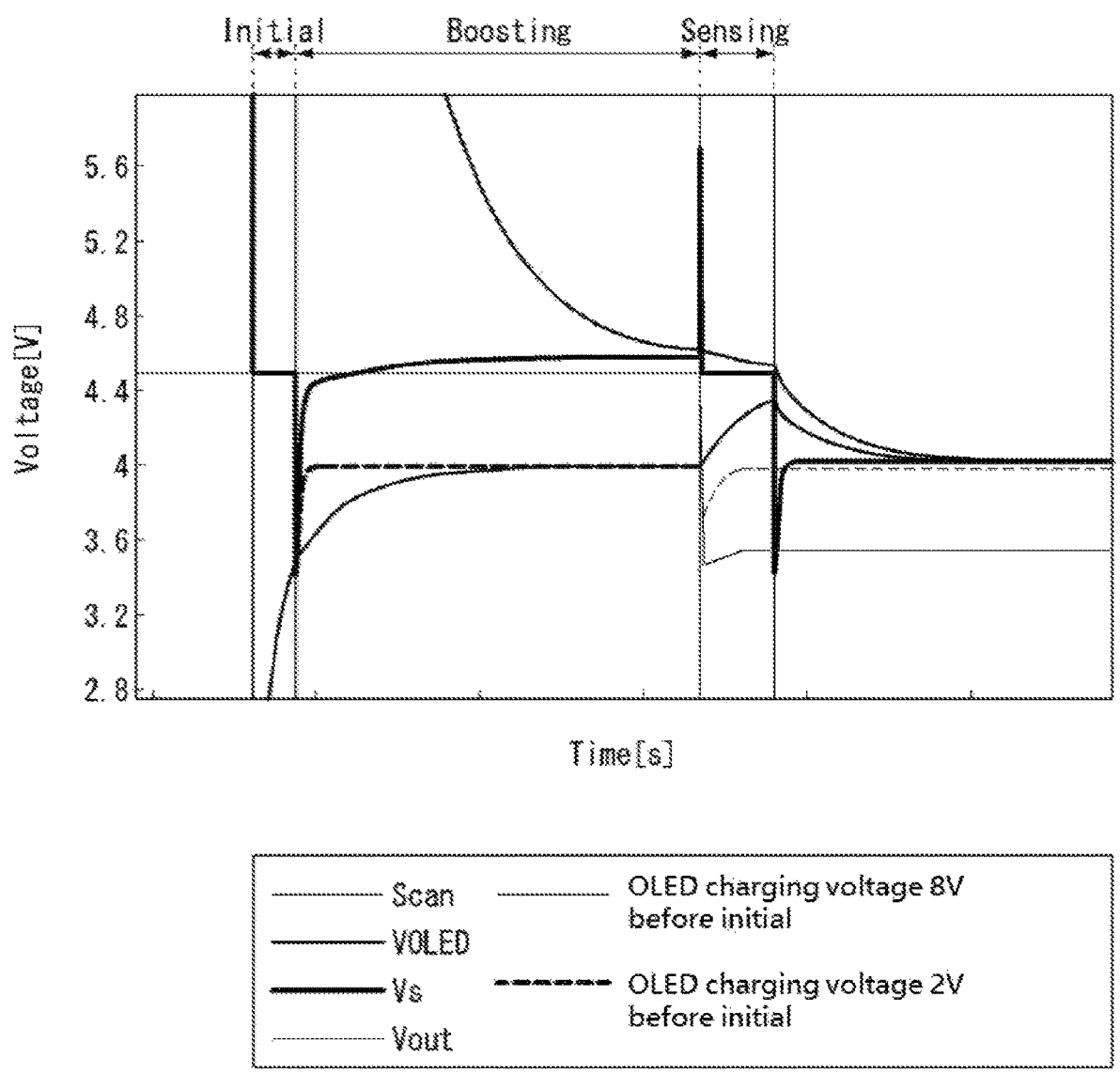
FIGS. 15 and 16 show simulation results by which the effects according to initial period increase according to an embodiment of the present invention can be ascertained.
Figure 16:
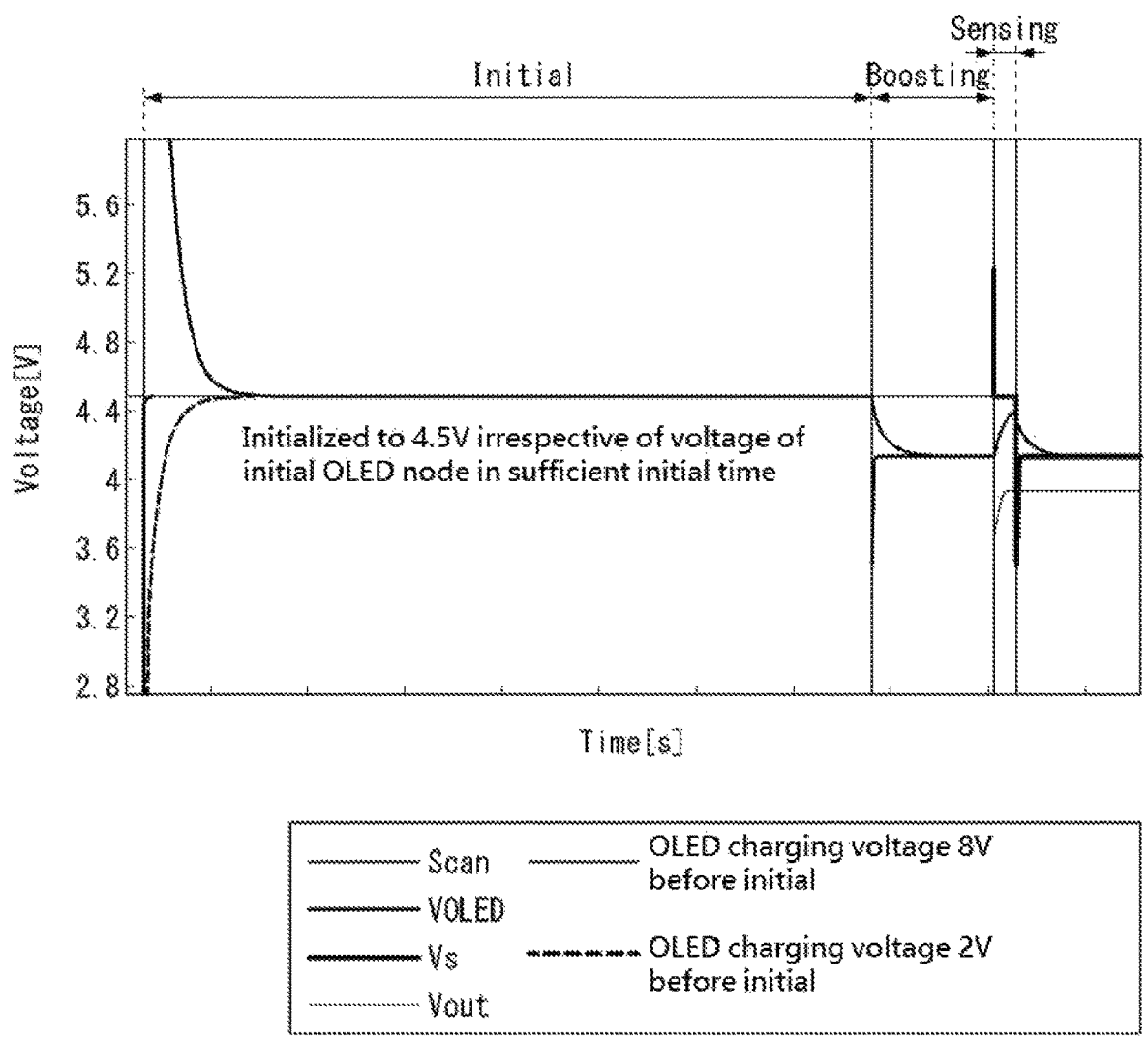

FIG. 13 is an exemplary diagram for aiding in understanding sensing and initialization methods according to an embodiment of the present invention, FIG. 14 illustrates an example of driving waveforms of subpixels of FIG. 13, and FIGS. 15 and 16 show simulation results by which the effects according to initial period increase according to an embodiment of the present invention can be ascertained.

As shown in FIGS. 13 and 14, a first subpixel SP1 can be defined as a sensing subpixel and second to fourth subpixels SP2 to SP4 can be defined as non-sensing subpixels. A total of four subpixels including the first to fourth subpixels SP1 to SP4 can be connected to a first sensing line VREF1. In addition, the first to fourth subpixels SP1 to SP4 can include red, green, blue and white subpixels.

A scan signal SCAN can be applied as a scan high voltage for an initial period, applied as a scan low voltage for a boosting period and applied as the scan high voltage for a sensing period. A data voltage Data applied to the first data line DL1 can be applied as a voltage (e.g., 0.5 V) of a black sensing level for the initial period, the boosting period and the sensing period. A reference voltage Ref (e.g., 4.5 V) applied to the first sensing line VREF1 can be maintained in the same conditions. Consequently, a source voltage DT-Vs of the driving transistor DT increases (2 V→4.5 V) and a voltage Voled of the anode electrode of the OLED also increases (2 V→4.5 V).

The first subpixel SP1 corresponds to a sensing subpixel and has a lower resistance value (lower resistance value in the equivalent circuit of the OLED) than that of a non-sensing subpixel since a voltage level in a range within which the OLED emits light is applied thereto. Accordingly, the first subpixel SP1 can apply the sensing voltage of the OLED for a relatively short time (time shorter than a time in which the initialization voltage of the non-sensing subpixel is applied).

On the other hand, the second to fourth subpixels SP2 to SP4 correspond to a non-sensing subpixel and have a higher resistance value (higher resistance value in the equivalent circuit of the OLED) than that of the sensing subpixel since a voltage level in a range within which the OLED does not emit light is applied thereto. Accordingly, the second to fourth subpixels SP2 to SP4 can apply the initialization voltage of the OLED for a relatively long time (time longer than a time in which the sensing voltage of the sensing subpixel is applied). For example, the second to fourth subpixels SP2 to SP4 corresponding to a non-sensing subpixel have an initial period for applying the initialization voltage for a time longer than that of the first subpixel SP1 corresponding to a sensing subpixel.

As shown in FIG. 15, when a short initial period is set, voltages VOLED and Vs of a sensing node between the source electrode of the driving transistor and the anode electrode of the OLED and a voltage Vout at the time of sensing through the sensing node do not converge on the initialization voltage (e.g., 4.5 V) and can include a voltage lower or higher than the initialization voltage.

However, when a long initial period is set as in the embodiment, as shown in FIG. 16, the voltages VOLED and Vs of the sensing node between the source electrode of the driving transistor and the anode electrode of the OLED and the voltage Vout at the time of sensing through the sensing node converge on the initialization voltage (e.g., 4.5 V) and can include almost the same voltages.

As can be ascertained from the simulation results of FIGS. 15 and 16, initialization can be performed using the same voltage irrespective of the voltages between the source electrode of the driving transistor and the anode electrode of the OLED when the initial period is set to be longer than the boosting period or the sensing period as in the embodiment.

Figure 17:
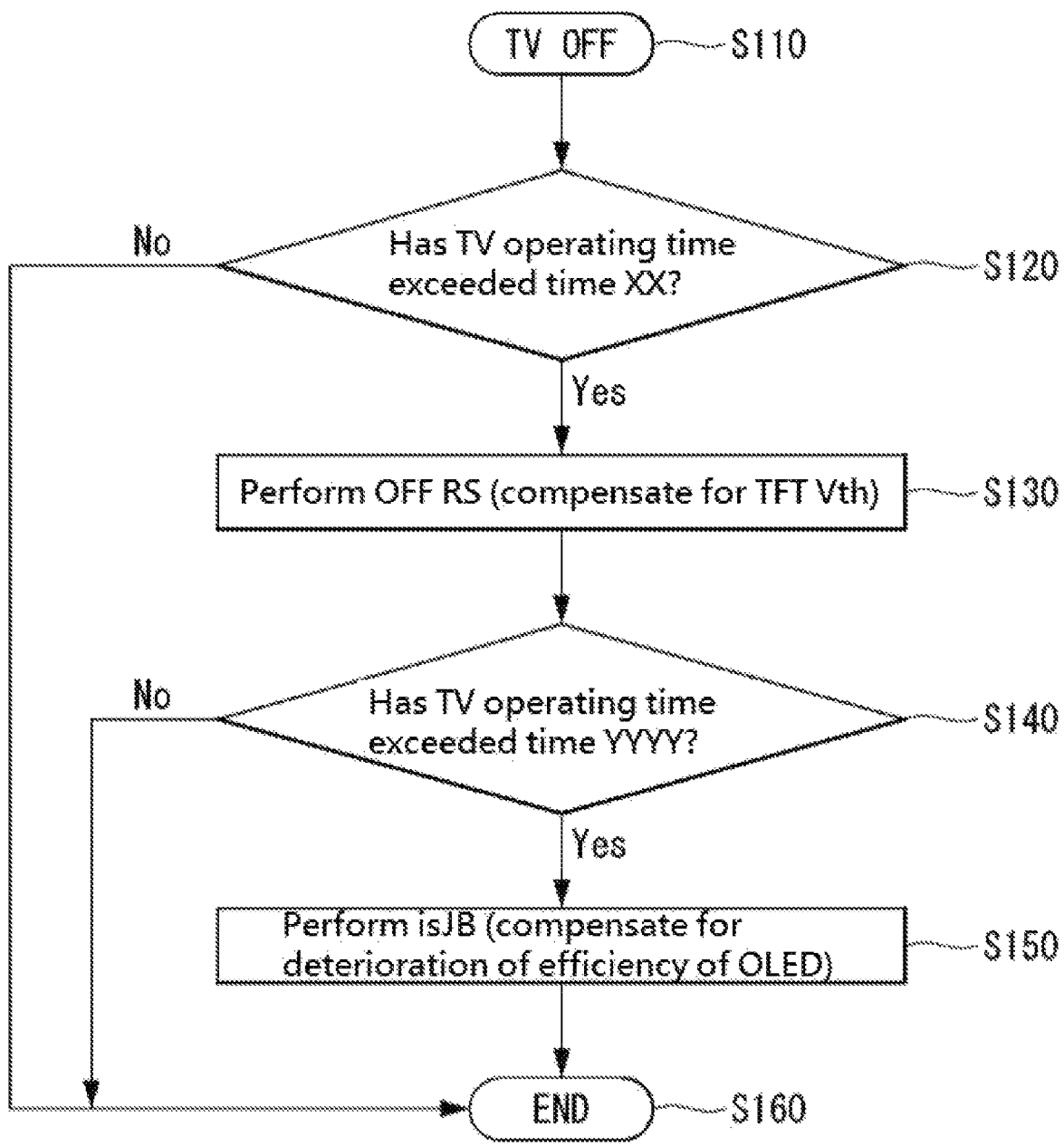
FIG. 17 is a diagram for describing an application of the method of driving an organic light emitting display device according to an embodiment of the present invention.

FIG. 17 is a diagram for describing an application of the method of driving an organic light emitting display device according to an embodiment of the present invention.

As shown in FIG. 17, the method of driving an organic light emitting display device according to the embodiment of the present invention is applicable to a TV receiver. The TV receiver can be turned off according to a remote controller operation of a user. After the TV receiver is turned off, an operation of compensating for the threshold voltage of driving transistors and an operation of compensating for the efficient (deterioration) of OLEDs can be performed, which will be briefly described below.

First, when the TV receiver is turned off (S110), it can be determined whether an operation time of the TV receiver has exceeded a time XX (XX refers to a first reference time set in the TV receiver) (S120). When the operation time of the TV receiver has not exceeded the first reference time (No), an unnecessary compensation operation can be skipped and the procedure can end (S160).

However, it is determined that the operation time of the TV receiver has exceeded the first reference time (Yes), a first compensation operation (OFF RS) (OFF RS is to a compensation operation performed after the display device is turned off) for compensating for the threshold voltage of driving transistors (TFT Vth compensation) (compensation for the threshold voltage of thin-film transistor) can be performed (S130). To compensate for a threshold voltage deviation of the driving transistors in response to the first compensation operation (OFF RS), current flowing through sensing nodes between the source electrodes of the driving transistors and the anode electrodes of the OLEDs can be detected.

Then, it can be determined whether the operation time of the TV receiver has exceeded a time YYYY (YYYY refers to a second reference time set in the TV receiver which is longer than the first reference time) (S140). When the operation time of the TV receiver has not exceeded the second reference time (No), an unnecessary compensation operation can be skipped and the procedure can end (S160).

However, if it is determined that the operation time of the TV receiver has exceeded the second reference time (Yes), a second compensation operation (isJB) for compensating for the efficient (deterioration) of the OLEDs can be performed (S150). To compensate for deterioration of the efficiency of the OLEDs in response to the second compensation operation (isJB), charges accumulated in parasitic capacitors of the OLEDs can be sensed and deterioration of elements included in subpixels can be compensated on the basis of the sensed charges.

When the user turns on the TV receiver during the first compensation operation (OFF RS) (S130) or the second compensation operation (isJB) (S150), a compensation operation including a sensing operation can be stopped.

As described above, the embodiments of the present invention can converge voltages around sensing nodes on almost the same initialization voltages even when the sensing nodes are initialized using a voltage lower than the threshold voltage of OLEDs. In addition, the embodiments of the present invention can reduce a sensing deviation generation probability on the basis of conditions for sufficient initialization of non-sensing subpixels and improve sensing accuracy and compensation accuracy (compensate for image sticking) to realize a screen with high display quality.

What is claimed is:

1. A light emitting display device, comprising:
a display panel including M subpixels sharing a single sensing line, wherein M is an integer equal to or greater than 2; and
a circuit for sensing elements included in at least one of the M subpixels through the sensing line,
wherein a first subpixel from among the M subpixels is defined as a sensing subpixel, a second subpixel among the M subpixels is defined as a non-sensing subpixel, and the second subpixel has an initial period for applying an initialization voltage for a time longer than a data writing period for applying a sensing voltage to the first subpixel.

2. The light emitting display device of claim 1, wherein the initial period for the second subpixel occurs ceaselessly.

3. The light emitting display device of claim 2, wherein the initial period for the second subpixel is longer than a sensing period for sensing the first subpixel.

4. The light emitting display device of claim 3, wherein the data writing period for the first subpixel and the sensing period for the first subpixel alternate.

5. The light emitting display device of claim 4, wherein the data writing period for the first subpixel and the sensing period for the first subpixel are alternately repeated K times and discontinuously occur distinguished from the initial period for the second subpixel, wherein K is an integer equal to greater than 2.

6. The light emitting display device of claim 5, wherein the initial period for the second subpixel occurs ceaselessly for an I-th time, and wherein the I-th time is defined as a time longer than a boosting period present between the data writing period and the sensing period, a time necessary for at least two of the data writing period, the boosting period and the sensing period, or a time corresponding to the sum of the data writing period and the sensing period.

7. The light emitting display device of claim 4, wherein one period in which repeated sensing is performed K times is included in one line of the display panel where K is an integer equal to greater than 2, and the periods in all lines of the display panel do not overlap so that a sensing line is not repeatedly selected.

8. The light emitting display device of claim 1, wherein the sensing voltage is set to a voltage level at which an organic light-emitting diode (OLED) included in the first subpixel emits light, and the initialization voltage is set to a voltage level at which an OLED included in the second subpixel does not emit light.

9. The light emitting display device of claim 1, wherein the first subpixel has a resistance value lower than a resistance of the second subpixel.

10. A method of driving a light emitting display device, the method comprising:
applying an initialization voltage for initializing an organic light-emitting diode (OLED) included in a non-sensing subpixel from among M subpixels in an initial period, where M is an integer equal to or greater than 2;
applying a sensing voltage for sensing an OLED included in a sensing subpixel from among the M subpixels in a data writing period;
floating an anode electrode of the OLED included in the sensing subpixel in a boosting period; and
sensing the OLED included in the sensing subpixel in a sensing period,
wherein the initial period is longer than the data writing period.

11. The method of claim 10, wherein the initial period occurs ceaselessly, and the data writing period and the sensing period are alternately repeated K times and discontinuously occur distinguished from the initial period, wherein K is an integer equal to or greater than 2.

12. The method of claim 11, wherein one period in which repeated sensing is performed K times is included in one line of a display panel, and the periods in all lines of the display panel do not overlap so that a sensing line is not repeatedly selected.

13. The method of claim 10, wherein the initial period occurs ceaselessly for an I-th time, and
wherein the I-th time is defined as a time longer than the boosting period present between the data writing period and the sensing period, a time necessary for at least two of the data writing period, the boosting period and the sensing period, or a time corresponding to the sum of the data writing period and the sensing period.

14. The method of claim 10, wherein the sensing voltage is set to a voltage level at which the OLED included in the sensing subpixel emits light, and the initialization voltage is set to a voltage level at which the OLED included in the non-sensing subpixel does not emit light.

* * * * *